United States Patent
Chang et al.

(10) Patent No.: US 8,421,149 B2
(45) Date of Patent: Apr. 16, 2013

(54) TRENCH POWER MOSFET STRUCTURE WITH HIGH SWITCHING SPEED AND FABRICATION METHOD THEREOF

(75) Inventors: Yuan-Shun Chang, Taipei (TW); Kao-Way Tu, New Taipei (TW)

(73) Assignee: Great Power Semiconductor Corp., New Taipei (TW)

( * ) Notice: Subject to any disclaimer, the term of this patent is extended or adjusted under 35 U.S.C. 154(b) by 0 days.

(21) Appl. No.: 13/115,981

(22) Filed: May 25, 2011

(65) Prior Publication Data

US 2012/0299109 A1    Nov. 29, 2012

(51) Int. Cl.
*H01L 29/66* (2006.01)

(52) U.S. Cl.
USPC ........... 257/331; 257/328; 257/329; 257/330; 257/332; 257/E27.091; 438/270

(58) Field of Classification Search .................. 257/302, 257/328, 329, 330, 331, 332, E27.091; 438/270
See application file for complete search history.

(56) References Cited

U.S. PATENT DOCUMENTS

2012/0299091 A1* 11/2012 Tsai et al. ...................... 257/334

* cited by examiner

*Primary Examiner* — Julio J Maldonado
*Assistant Examiner* — Amar Movva
(74) *Attorney, Agent, or Firm* — Li & Cai Intellectual Property (USA) Office

(57) ABSTRACT

A fabrication method of trench power semiconductor structure with high switching speed is provided. An epitaxial layer with a first conductivity type is formed on a substrate. Then, gate structures are formed in the epitaxial layer. A shallow doped region with the first conductivity type is formed in the surface layer of the epitaxial layer. After that, a shielding structure is formed on the shallow doped region. Then, wells with a second conductivity type are formed in the epitaxial layer by using the shielding structure as an implantation mask. Finally, a source doped region with the first conductivity type is formed on the surface of the well. The doping concentration of the shallow doped layer is smaller than that of the source doped region and the well. The doping concentration of the shallow doped layer is larger than that of the epitaxial layer.

12 Claims, 6 Drawing Sheets

US 8,421,149 B2

TRENCH POWER MOSFET STRUCTURE WITH HIGH SWITCHING SPEED AND FABRICATION METHOD THEREOF

BACKGROUND OF THE INVENTION (1) Field of the Invention

This invention relates to a trench power semiconductor structure and a fabrication method thereof, and more particularly relates to a trench power semiconductor structure with high switching speed and a fabrication method thereof.

(2) Description of the Prior Art

Switching speed is an important characteristic for the application of trench power semiconductor devices. The enhancement of switching speed is helpful for improving switching loss of high frequency applications. FIG. 1 is a cross-section view of a typical n-channel trench metal-oxide-semiconductor field effect transistor (MOSFET). As shown, the n-channel trench MOSFET has an n-type drain region 110, a p-type body region 120, an n-type source region 130, a metal layer 140 coupled to a source electrode, a gate oxide layer 150, and a polysilicon gate 160.

At the moment that the MOSFET is being switched off, a reverse current is generated to remove the excessive minority carriers in the body diode. However, restricted by the body diode, it is hard to reduce the source-to-drain forward voltage ($VF_{SD}$) of the trench power semiconductor structure below 0.75V. Thus, an apparent time period is usually demanded for removing the excessive minority carriers and thus the switching speed of the power MOSFET is thus restricted by the reverse recovery ability of the power MOSFET, which also results in the increasing of switching loss.

Accordingly, it is eager for the skilled in the art to find out a reliable trench power semiconductor structure with low source-to-drain forward voltage ($VF_{SD}$) and acceptable breakdown voltage to overcome the above mentioned drawbacks.

SUMMARY OF THE INVENTION

Based on the above mentioned problems, it is a main object of the present invention to reduce the source-to-drain forward voltage ($VF_{SD}$) of the trench power semiconductor structure with the withstand voltage of the gate oxide layer and the breakdown voltage being maintained. Thus, a trench power semiconductor device with high switching speed and low switching loss as well as the fabrication method thereof can be accessed.

To achieve the above mentioned object, a fabrication method of a trench power semiconductor structure with high switching speed is provided in accordance with a preferred embodiment of the present invention. Firstly, an epitaxial layer of a first conductive type is formed on a substrate. Then, a plurality of gate structures is formed in the epitaxial layer. Afterward, a shallow doped region of the first conductive type is formed in a surface layer of the epitaxial layer. Then, a shielding structure is formed on the shallow doped regions. Thereafter, a plurality of wells of a second conductive type is formed in the epitaxial layer with at least a portion of the shallow doped region being shielded by the shielding structure. Then, a source doped region of the first conductive type is formed in the well. Wherein, the doping concentration of the shallow doped region is smaller than that of the source doped region and the well, but is greater than that of the epitaxial layer.

A trench power semiconductor structure with high switching speed is also provided in the present invention. The trench power semiconductor structure has a substrate, an epitaxial layer, a plurality of gate structures, a plurality of wells of a second conductive type, a shallow doped region of the first conductive type, a shielding structure, and a source doped region of the first conductive type. The epitaxial layer is formed on the substrate. The gate structures are located in the epitaxial layer. The wells are located in the epitaxial layer, and the neighboring wells are kept away with a predetermined distance. The shallow doped region is located in the epitaxial layer between the neighboring wells. The shielding structure is located on the shallow doped region. The source doped region is located in the well. The doping concentration of the shallow doped region is smaller than that of the source doped region and the well but is greater than that of the epitaxial layer.

BRIEF DESCRIPTION OF THE DRAWINGS

The present invention will now be specified with reference to its preferred embodiment illustrated in the drawings, in which.

DESCRIPTION OF THE PREFERRED EMBODIMENT

It is a main feature of the present invention to form a shallow doped region with a conductive type identical to that of the source doped region. The shallow doped region is located between the neighboring wells as a path for the reverse current for removing the excessive minority carriers while the power MOSFET is being switched off. The source-to-drain forward voltage ($VF_{SD}$) can be reduced to about 0.1-0.2 V to prevent the body diode from being turned on and the excessive minority carriers can be rapidly removed. Thus, the reverse recovery ability of the power MOSFET can be significantly enhanced to reduce switching loss. In addition to the above mentioned advantages, the structure provided in the present invention does not have to sacrifice the withstanding voltage of the gate oxide layer and the breakdown voltage (BVDSS) such that a power MOSFET with great reliability and high switching speed can be accessed.

Figure 1:
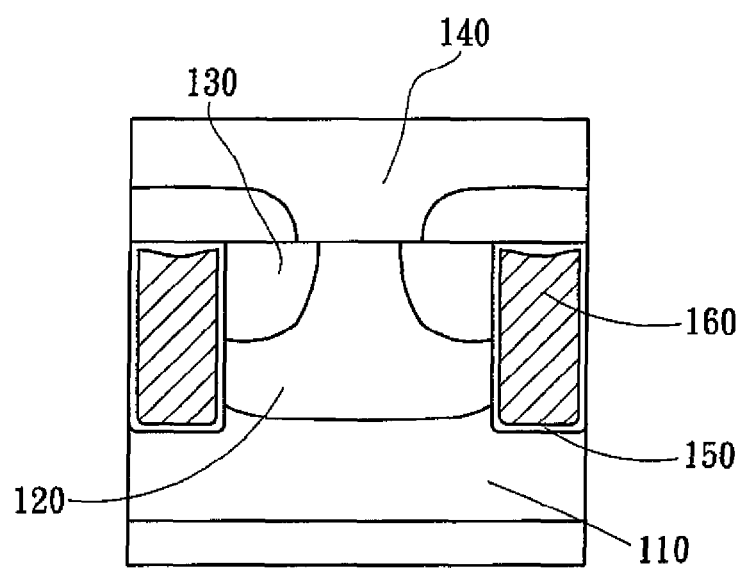
FIG. 1 is a cross-section view showing a typical n-channel trench MOSFET.
Figure 2A:
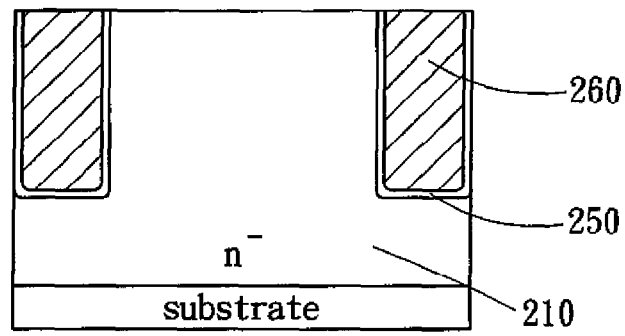
FIGS. 2A to 2E are schematic views showing a fabrication of the trench power semiconductor structure in accordance with a first embodiment of the present invention.

FIGS. 2A to 2E are schematic views showing a fabrication method of a trench power semiconductor structure in accordance with a first embodiment of the present invention. As shown in FIG. 2A, an epitaxial layer 210 of a first conductive type is formed on a substrate. In the present embodiment, the first conductive type is n-type. Thereafter, a plurality of trenches is formed in the epitaxial layer 210 by etching. Then, the trenches are lined with a gate dielectric layer 250 and filled with a polysilicon gate 260 so as to form the gate structures in the epitaxial layer 210.

Figure 2B:
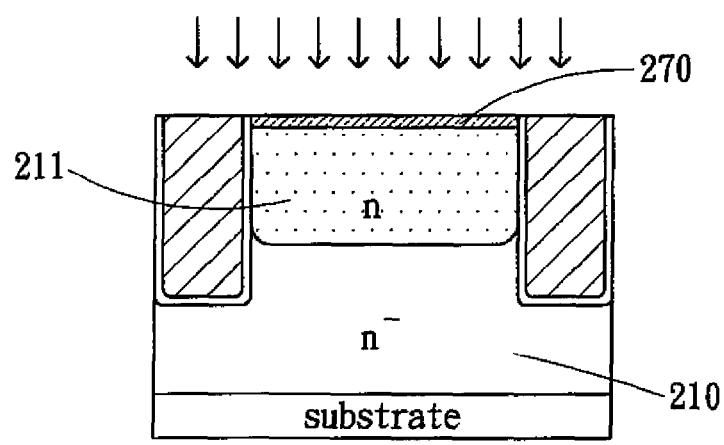

Then, as shown in FIG. 2B, an ion implantation step is carried out to implant n-type dopants into the epitaxial layer 210 and a thermal diffusion step follows to form an n-type diffusion region 211 in the epitaxial layer 210. Thereafter, another ion implantation step is carried out to implant additional n-type dopants in the surface layer of the epitaxial layer 210 so as to form a shallow doped region 270 with a doping concentration higher than that of the epitaxial layer 210 and the n-type diffusion region 211. Since the doping concentration of the n-type diffusion region 211 is higher than that of the epitaxial layer 210, the n-type dopants within the n-type diffusion region 211 may hinder the lateral extension of the p-type well formed in the following step, so as to leave a source-to-drain current path below the neighboring wells. The above mentioned ion implantation step for forming the n-type diffusion region may be skipped. In addition, as a preferred embodiment, the doping concentration of the shallow doped region 270 is greater than that of the n-type diffusion region 211 but smaller than that of the well.

Figure 2C:
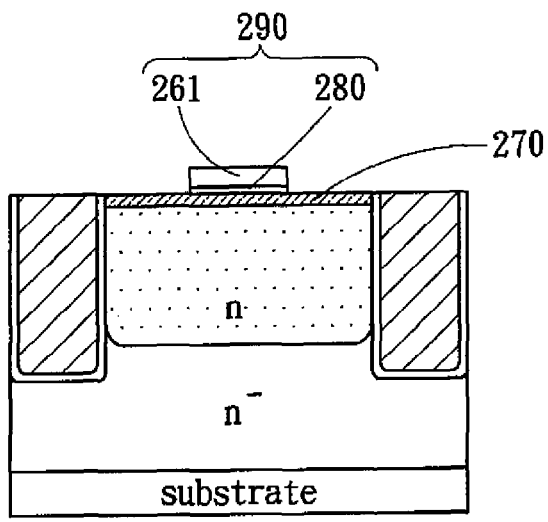

Then, as shown in FIG. 2C, a shielding structure 290 is formed above the shallow doped region 270 to define the location of wells and source doped regions formed in the following steps. According to a preferred embodiment, the shielding structure 290 may be fabricated by using the steps as follows. Firstly, a dielectric layer 280 is firstly formed on the epitaxial layer 210, and then a polysilicon structure 261 is formed on the dielectric layer 280. The polysilicon structure 261 may be electrically connected to a source electrode for applying a potential to the shallow doped region 270 for further increasing the reverse current to remove the excessive minority carriers at the moment that the power MOSFET is being switched off.

Figure 2D:
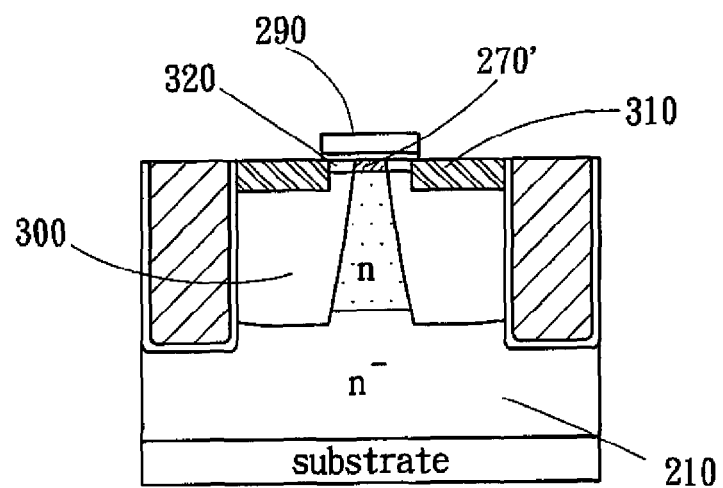

Thereafter, as shown in FIG. 2D, a well implantation step is carried out by using the shielding structure 290 as a mask to implant dopants of a second conductive type into the epitaxial layer 210. The second conductive type is p-type. Then, a thermal diffusion step is carried out to form the p-type well 300. After the formation of the p-type well 300, a source implantation step is carried out to implant high concentration n-type dopants into the well 300 and then a thermal diffusion step is used so as to form an n-type source doped region 310 in the well 300. It is noted that after the above mentioned thermal diffusion steps, the implanted n-type dopants and p-type dopants would be laterally diffused to the region below the shielding structure 290 such that a portion of the well 300 and the source doped region 310 would be overlapped with the shielding structure 290 as shown in FIG. 2D. In the present embodiment, since the doping concentration of the well 300 is higher than the prior-formed shallow doped region 270 as shown in FIG. 2C, a n-type shallow doped region 270' and a p-type surface doped region 320 are formed in the surface layer of the epitaxial layer 210 after the formation of the well 300. The p-type surface doped region 320 is located between the source doped region 310 and the n-type shallow doped region 270', and a doping concentration of the p-type surface doped region 320 would be smaller than that of the well 300 because of the implanted n-type dopants.

Figure 2E:
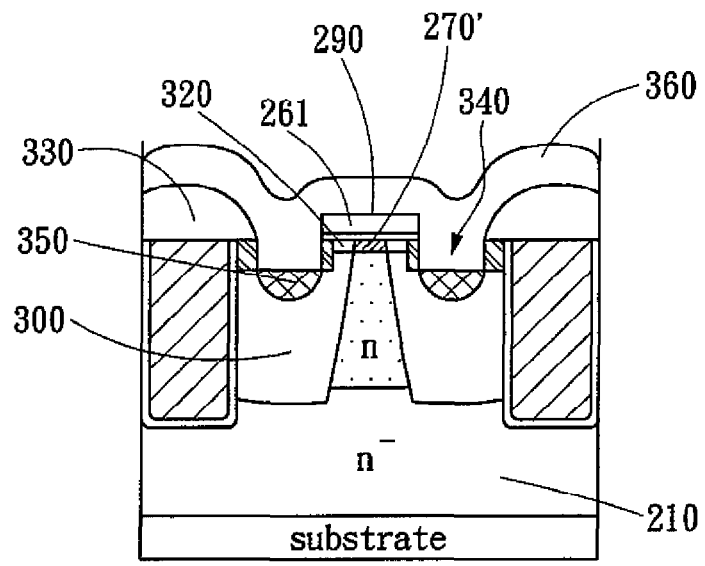

Next, as shown in FIG. 2E, a dielectric structure 330 is formed on the gate structure. The dielectric structure 330 and the shielding structure 290 define the location of the source contact window 340 for exposing the well 300 and the source doped region 310. After the formation of the source contact window 340, an ion implantation step is carried out to implant p-type dopants in the well 300 so as to form a contact doped region 350 at the bottom of the source contact window 340. Finally, a source metal layer 360 is formed on the shielding structure 290 and fills the source contact window 340. The source metal layer 360 is electrically connected to the source doped region 310 and the polysilicon structure 261 such that the source doped region 310 and the polysilicon structure 261 may possess identical potential levels. The contact doped region 350 is utilized for reducing the contact resistance between the source metal layer 360 and the well 300. According to the semiconductor structure mentioned above, at the moment that the power MOSFET is being switched off, the shallow doped region 270' and the p-type surface doped region 320 may compose an alternative path for reverse current to have the source-to-drain forward voltage ($VF_{SD}$) reduced to about 0.1-0.2V. Thus, the reverse recovery ability of the power MOSFET can be effectively enhanced.

Figure 3:
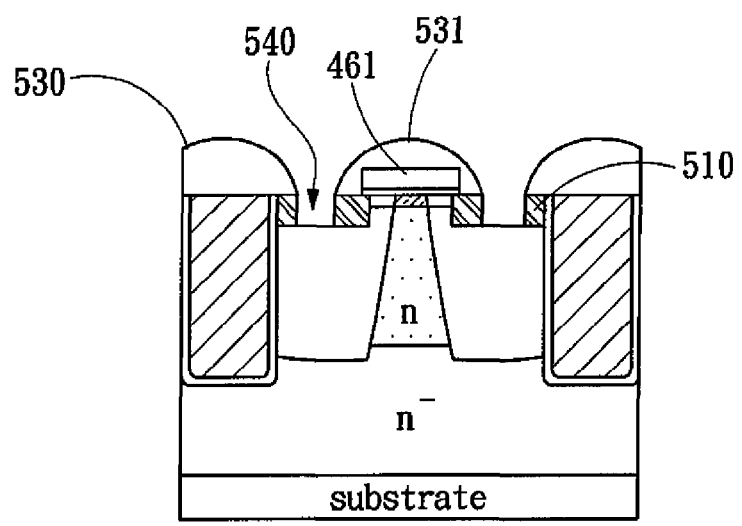
FIG. 3 is a schematic view showing a fabrication method of the trench power semiconductor structure in accordance with a second embodiment of the present invention.

FIG. 3 is a cross-section view showing a fabrication of the trench power semiconductor structure in accordance with a second embodiment of the present invention. The major difference between the present embodiment and the first embodiment is that, in the step of forming the dielectric structure 530 on the gate structure, a dielectric structure 531 is simultaneously formed on the polysilicon structure 461 according to the present embodiment. The formation of the dielectric structure 531 guarantees bigger source doped regions 510 at the opposite sides the polysilicon structure 461 and the polysilicon structure 461 may be electrically connected to the source electrode in the following steps. The other steps are similar to that of the first embodiment and thus are not repeated here.

Figure 4A:
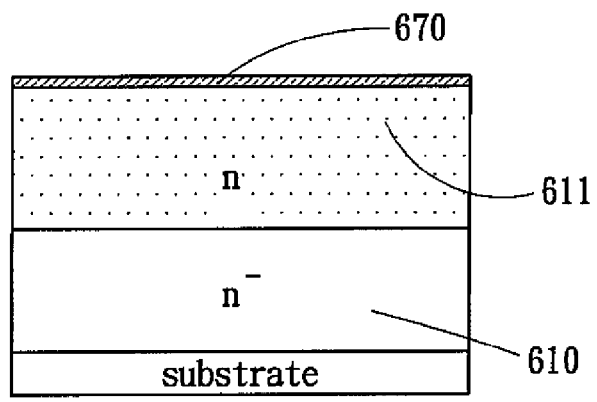
FIGS. 4A to 4C are schematic views showing a fabrication method of the trench power semiconductor structure in accordance with a third embodiment of the present invention.
Figure 4B:
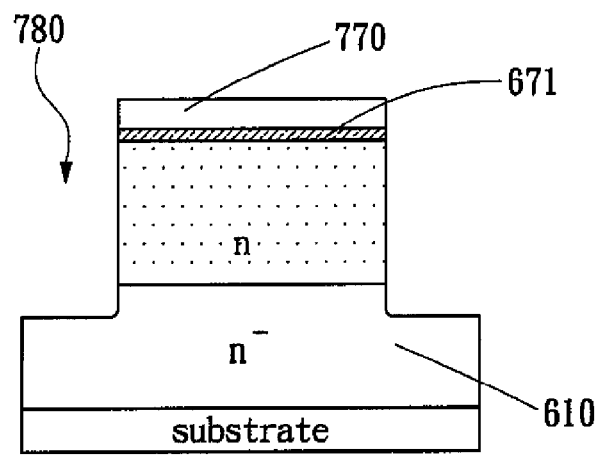
Figure 4C:
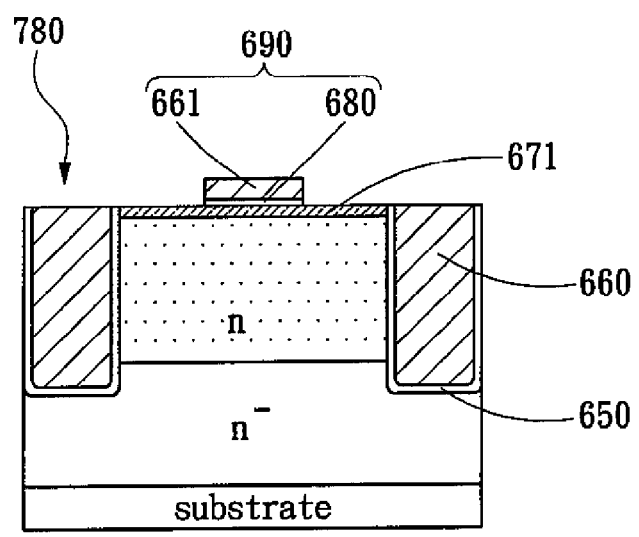

FIGS. 4A to 4C are schematic views showing a fabrication method of a trench power semiconductor structure in accordance with a third embodiment of the present invention. A major difference between the present embodiment and the first embodiment is that, the step of forming the shallow doped region 670 is prior to the formation of the gate structure in the present embodiment. In detailed, as shown in FIG. 4A, after the formation of the epitaxial layer 610 on the substrate, the n-type diffusion region 611 is formed in the epitaxial layer 610 and then the shallow doped region 670 is formed in a surface layer of the epitaxial layer 610. Since the major function of the n-type diffusion region 611 is for controlling the laterally extension of the well, the step of forming the n-type diffusion region 611 may be skipped in the present embodiment.

Afterward, as shown in FIG. 4B, a passivation layer 770 is formed over the epitaxial layer 610 to define the location of the gate structure as well as the range of the shallow doped region 671. Afterward, the gate trench 780 is formed in the epitaxial layer 610.

Then, as shown in FIG. 4C, a dielectric layer 680 is formed on the shallow doped region 671 and a gate dielectric layer 650 is formed in the gate trench 780 simultaneously. Next, a polysilicon layer is deposited over the dielectric layer 680 and the gate dielectric layer 650, and a lithographic and etching step is carried out to remove the unwanted portion of the polysilicon layer so as to leave the polysilicon structure 661 and the polysilicon gate 660. In the present embodiment, the gate structure and the shielding structure 690 are simultaneously formed on the epitaxial layer, however, the present embodiment is not so restricted and the two structures may be fabricated in different steps. In addition, as a preferred embodiment, the steps after the formation of the shallow doped region 671 should be maintained at a low temperature to prevent over-diffusion of the dopants within the shallow doped region 671 so as to guarantee the range and the concentration of the shallow doped region 671.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A fabrication method of a trench power semiconductor structure with high switching speed, comprising the steps of:
providing a substrate;
forming an epitaxial layer of a first conductive type on the substrate;
forming a plurality of gate structures in the epitaxial layer;
forming a shallow doped regions of the first conductive type in a surface layer of the epitaxial layer;
forming a shielding structure on the shallow doped regions;
forming a plurality of wells of a second conductive type in the epitaxial layer with at least a portion of the shallow doped region being shielded by the shielding structure; and
forming a source doped region of the first conductive type in the well;
wherein a doping concentration of the shallow doped region is smaller than that of the source doped region and the well, but is greater than that of the epitaxial layer.

2. The fabrication method of a trench power semiconductor structure with high switching speed of claim 1, wherein the step of forming the shallow doped region is prior to the step of forming the gate structure.

3. The fabrication method of a trench power semiconductor structure with high switching speed of claim 2, wherein the shielding structure and the gate structures are simultaneously formed on the shallow doped region and in the epitaxial layer respectively.

4. The fabrication method of a trench power semiconductor structure with high switching speed of claim 1, wherein the shielding structure has a dielectric layer and a polysilicon layer on the dielectric layer.

5. The fabrication method of a trench power semiconductor structure with high switching speed of claim 1, further comprising the steps of:
forming a first dielectric structure on the gate structure; and
forming a source contact window to expose the well and the source doped region by using the shielding structure and the first dielectric structure;
wherein a bottom of the source contact window is below a lower surface of the source doped region.

6. The fabrication method of a trench power semiconductor structure with high switching speed of claim 5, wherein in the step of forming the first dielectric structure, a second dielectric structure is simultaneously formed on the shielding structure.

7. A trench power semiconductor structure with high switching speed, comprising:
an epitaxial layer of a first conductive type;
a plurality of gate structures, located in the epitaxial layer;
a plurality of wells of a second conductive type, located in the epitaxial layer, and a neighboring pair of the wells being kept away from each other with a predetermined distance;
a shallow doped region of the first conductive type, located in the epitaxial layer between the neighboring pair of the wells;
a shielding structure, located on the shallow doped region; and
a source doped region of the first conductive type, located in the well;
wherein a doping concentration of the shallow doped region is smaller than that of the source doped region and the well but is greater than that of the epitaxial layer.

8. The trench power semiconductor structure with high switching speed of claim 7, wherein the well has a surface doped region of the second conductive type with a smaller doping concentration, and the surface doped region is located between the shallow doped region of the first conductive type and the source doped region.

9. The trench power semiconductor structure with high switching speed of claim 7, wherein a depth of the shallow doped region of the first conductive type is smaller than that of the source doped region.

10. The trench power semiconductor structure with high switching speed of claim 7, wherein the shielding structure has:
a dielectric layer; and
a polysilicon layer, on the dielectric layer.

11. The trench power semiconductor structure with high switching speed of claim 10, wherein the polysilicon layer is electrically connected to a source electrode.

12. The trench power semiconductor structure with high switching speed of claim 7, further comprising:
a first dielectric structure, located on the gate structure; and
a conductive structure, connected to the well via a source contact window.

* * * * *